United States Patent [19]

Noda et al.

[11] Patent Number: 4,491,809
[45] Date of Patent: Jan. 1, 1985

[54] MATCHING CIRCUIT FOR A PRE-AMPLIFIER OF SHF BAND TELEVISION SIGNAL RECEIVER

[75] Inventors: Masaki Noda; Keiro Shinkawa; Chuichi Sodeyama, all of Yokohama, Japan

[73] Assignee: Hitachi, Ltd., Tokyo, Japan

[21] Appl. No.: 406,567

[22] Filed: Aug. 9, 1982

[30] Foreign Application Priority Data

Aug. 12, 1981 [JP] Japan ................. 56-125175

[51] Int. Cl.$^3$ ............................. H01P 5/08
[52] U.S. Cl. ................... 333/35; 330/277; 330/286
[58] Field of Search ............ 330/277, 286; 333/33, 333/35

[56] References Cited

U.S. PATENT DOCUMENTS 3,662,294  5/1972  Jacobs et al. ............ 333/33
3,940,706  2/1976  Stegens .................. 330/286
4,053,842  10/1977 Turski et al. ........... 330/277 X
4,320,353  3/1982  Sasaki ................... 330/286

FOREIGN PATENT DOCUMENTS 58305  5/1981  Japan ................. 330/286

OTHER PUBLICATIONS

Medley, Jr., et al., Broad-Band GaAs FET Amplifier Design Using Negative-Image Device Models, IEEE Trans. on MTT, Sep. '79, 330-386.

Primary Examiner—Paul Gensler
Attorney, Agent, or Firm—Antonelli, Terry & Wands

[57] ABSTRACT

A matching circuit for a pre-amplifier of an SHF band television signal receiver is disclosed. The matching circuit comprises a stub line arranged near a gate terminal of an FET, and a pair of stub lines connected to a transmission line, one being a stub line exhibiting a short circuit impedance at a lower frequency than operating frequencies of the matching circuit and the other being a stub line arranged oppositely to the stub line and exhibiting a short circuit at a higher frequency than the operating frequencies. A distance between the stub line and the pair of stub lines is selected to be approximately equal to ¼ wavelength of a center frequency of the desired signal band.

5 Claims, 10 Drawing Figures

MATCHING CIRCUIT FOR A PRE-AMPLIFIER OF SHF BAND TELEVISION SIGNAL RECEIVER

BACKGROUND OF THE INVENTION

1. Field of the Invention

The present invention relates to an input/output matching circuit for a pre-amplifier of an SHF band television signal receiver.

2. Description of the Prior Art

An SHF band television signal receiver is usually constructed as shown in FIG. 1. The SHF band signal is received by an antenna 1, a signal received by the antenna 1 is supplied to a pre-amplifier 2, and an amplified SHF band signal from the pre-amplifier 2 is supplied to a mixer 4 which also receives a local oscillation signal from a local oscillator 3 and converts the SHF band signal to an intermediate UHF band signal.

An input matching circuit for the preamplifier 2 as shown in FIG. 2a or FIG. 2b, which uses a field effect transistor (FET) has been known. The circuit shown in FIG. 2a comprises a ¼ wavelength transformer 5 constructed by a low impedance microstrip line which is connected to a gate electrode 7 of an FET 6. The circuit shown in FIG. 2b comprises an openended stub line 8 constructed by an appropriate impedance line which is connected to the gate electrode 7 of the FET 6. It utilizes a capacitive reactance of the stub line 8 and a phase rotation of a signal created between a center of the stub line 8 and the gate electrode 7. A source electrode 23 is usually grounded and a drain electrode 21 is connected to a transmission line 11 through a stub line 22.

In those prior art circuits, however, only a narrow band matching is attained because of a large input reflection coefficient. The SHF band receiver suffers from a disturbance by an image signal which is apart from the local oscillation frequency by the intermediate frequency. When an image suppression filter is connected to an input terminal of the pre-amplifier 2, the image signal can be eliminated, but since the image suppression filter further narrows the matching band, the image signal suppression is usually not effected in the pre-amplifier 2 but it is effected in the mixer 4 of the succeeding stage. In this case, if the disturbance power of the image signal is large, the pre-amplifier 2 saturates resulting in difficulty in the image signal suppression. In addition, the pre-amplifier 2 does not provide a satisfactory characteristic.

SUMMARY OF THE INVENTION

It is an object of the present invention to provide an input/output matching circuit for a pre-amplifier of an SHF band signal receiver.

It is a specific object of the present invention to provide a matching circuit having a wide band input/output characteristic and an excellent image disturbance suppression characteristic with a simple construction.

In order to achieve the above objects, in accordance with the present invention, a pair of stub lines constructed by image traps are arranged in the matching circuit located near a terminal of an FET. The pair of stub lines are spaced from the matching circuit by a distance approximately equal to ¼ wavelength at a center frequency of an operating frequency band. When a plurality of such stub line pairs are used, the matching circuit can provide a wide band input/output characteristic and an excellent image disturbance suppression characteristic.

DESCRIPTION OF THE PREFERRED EMBODIMENTS

Figure 3:
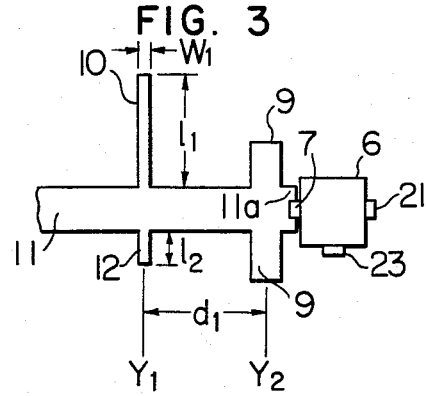
FIG. 3 shows a pattern of a first embodiment of a matching circuit of the present invention.

Referring to FIG. 3, one embodiment of the matching circuit of the present invention is explained.

The matching circuit of the present embodiment is an input matching circuit and comprises a stub line 9 arranged near a gate electrode 7 of an FET 6 and a pair of stub lines connected to a transmission line 11, one being a stub line 10 presenting or exhibiting a short circuit at a frequency lower than operating frequencies of the matching circuit, and the other being a stub line 12 arranged oppositely to the stub line 10 with respect to the transmission line 11 and presenting a short circuit at a frequency higher than the operating frequencies of the matching circuit. A distance between the stub line 9 and the pair of stub lines 10 and 12 is selected to be approximately equal to ¼ wavelength at a center frequency of the operating frequency band of the matching circuit.

In the operating frequency band, the stub line 10 acts as an inductive stub line and the stub line 12 acts as a capacitive stub line.

The operation when the operating frequencies are lower than the desired signal band is now explained. When the frequency of the image signal is lower than the operating frequencies, the stub line 10 presenting the short circuit at the frequency of the image signal acts as an image trap. The resonant frequency thereof is selected to be approximately equal to a frequency of the image signal. The resonant frequency of the stub line 12 is selected such that it presents a sufficient capacitive component to cancel an inductive component of the stub line 10 at the center frequency of the operating frequency band.

When the center frequency of the operating frequency band is 12.1 GHz and the frequency of the image signal is 9.5 GHz, the stub line 10 has a length $l_1$ approximately equal to 6.15 mm and a width $W_1$ of 0.5 mm and the stub line 12 has a length of $l_2$ approximately equal to 3.52 mm and a width $W_1$ of 0.5 mm. The distance $d_1$ between the center axis $Y_1$ of the stub lines 10 and 12 and the center axis $Y_2$ of the stub line is approximately 4.71 mm. The stub lines 9, 9 are connected to the gate electrode of the FET 6 through a connecting line 11a.

Figure 4:
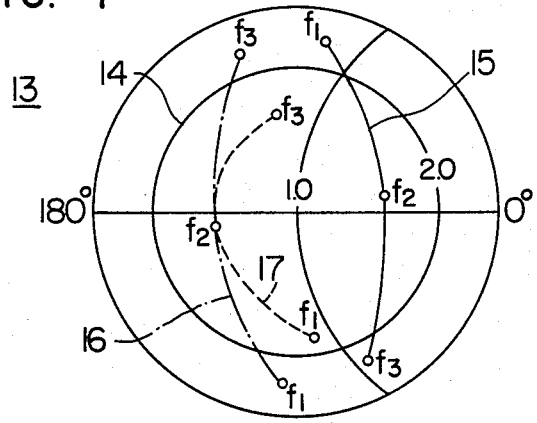
FIG. 4 shows a Smith chart for illustrating a characteristic of the matching circuit of the present invention.
Figure 5:
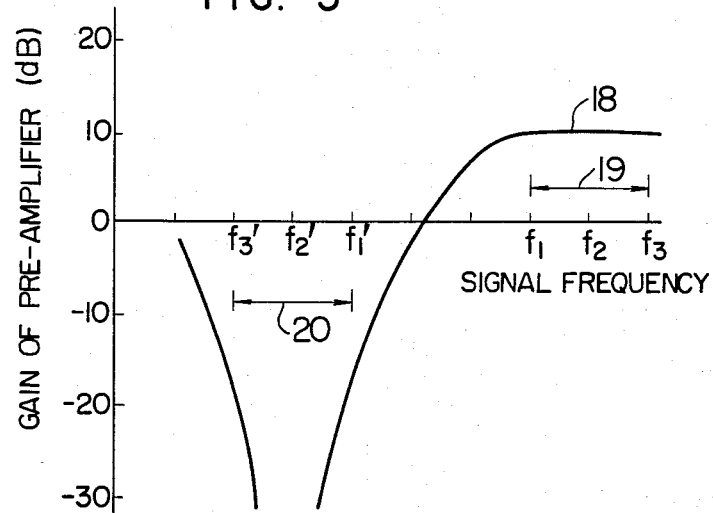
FIG. 5 shows a characteristic of a pre-amplifier which incorporates the matching circuit of the present invention.

FIG. 4 shows a Smith chart for illustrating a characteristic of the input matching circuit of the present embodiment. A lower end frequency of the band is $f_1$, a center frequency is $f_2$ and an upper end frequency is $f_3$. An input reflection coefficient of the pre-amplifier which is matched to a certain extent at the center frequency $f_2$ by the stub line 10 arranged near the gate electrode 7 is shown by a solid line 15. At the frequencies $f_1$ and $f_3$, an input VSWR of the pre-amplifier is higher than 2.0. The VSWR required for the pre-amplifier is lower than 2.0 and it must be within a range shown by a circle 14 in FIG. 4. When viewed from a point closer to a signal source by approximately ¼ wavelength of the frequency $f_2$, the input reflection coefficient has approximately 180° phase rotation and exhibits a characteristic shown by a one-dotted chain line 16. At this point, a composite impedance of the pair of stub lines 10 and 12 is inductive at a lower frequency than the frequency $f_2$ and capacitive at a higher frequency than the frequency $f_2$, and the admittances of the respective stub lines cancel each other at the frequency $f_2$. Thus, the input reflection coefficient of the pre-amplifier exhibits a characteristic shown by a broken line 17 so that a wide band characteristic is attained. The image trap by the stub line 10 exhibits a substantially short circuit and hence a low resistance component when the input impedance in the image signal exhibits the characteristic shown by the solid line 15, because the input reflection coefficient of the FET 6 is high. However, when the phase rotation of approximately 180° is included, the image trap exhibits a high resistance component and hence an effect of using the image trap is significant. FIG. 5 shows a characteristic of the pre-amplifier of the SHF band receiver which incorporates the input matching circuit of the present invention. A solid line 18 shows a gain characteristic of the pre-amplifier of the present invention. It shows an excellent image disturbance suppression characteristic in which a gain in the image signal band falls by approximately 30 dB at the opposite end of the operating frequency band shown by a solid line 20 and more than 40 dB at the center of the band.

Figure 6:
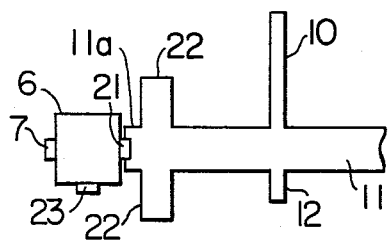
FIG. 6 shows a pattern of a second embodiment of the matching circuit of the present invention.

FIG. 6 shows a second embodiment of the matching circuit of the present invention. It is an output matching circuit and comprises a stub line 22 arranged near a drain electrode 21 of an FET 6 and a pair of stub lines 10 and 12 connected to a transmission line 11. The stub line 10 exhibits a short circuit at a frequency lower than the operating frequency band, and the stub line 12 is located oppositely to the stub line 10 with respect to the transmission line 11 and exhibits a short circuit at a higher frequency than the operating frequencies. A distance between the stub line 22 and the pair of stub lines 10 and 12 is approximately equal to ¼ wavelength of the center frequency of the operating frequency band. Like the input matching circuit, the present output matching circuit exhibits a wide band characteristic and an excellent image disturbance suppression characteristic.

Figure 7:
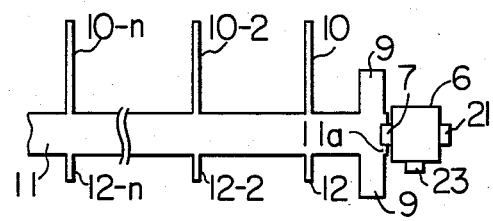
FIG. 7 shows a pattern of a third embodiment of the matching circuit of the present invention.

FIG. 7 shows another embodiment of the input matching circuit of the present invention. A pair of stub lines 10 and 12 which are identical to those shown in FIG. 5 is designated as a first pair, and a second pair of stub lines 10-2 and 12-2, ..., n-th pair of stub lines 10-n and 12-n are connected to the transmission line 11 at an interval of approximately ½ wavelength of the center frequency of the operating frequency band. In the present embodiment, since n image traps each identical to the stub line pairs 10 and 12 are connected in series, an excellent image disturbance suppression characteristic is attained. The input reflection coefficient does not change substantially because it shows a phase rotation of approximately 360° at the frequency $f_2$, but it is inductively affected at the lower frequecy than the center frequency and capacitvely affected at the higher frequency than the center frequency $f_2$ because of the composite impedance by the pairs of stub lines 10 and 12. However, by using lines having an appropriate characteristic impedance as the pairs of stub lines 10 and 12, the input matching circuit having a wide band input VSWR characteristic can be attained like in the first embodiment. When the image signal is at a higher frequency than the operating frequencies, an inductive stub line is used as the stub line 12.

When the image signal band is at a higher frequency than the operating frequencies, the stub line 12 which exhibits a short circuit at a higher frequency than the operating frequencies is used as the image trap and a resonant frequency there of is set to approximately center frequency of the image signal. The resonant frequency of the stub line 10 is selected such that it presents a sufficient inductive component to cancel a capacitive component of the stub line 12 at approximately the center frequency of the operating frequency band. An output matching circuit is constructed in the same structure.

Figure 1:
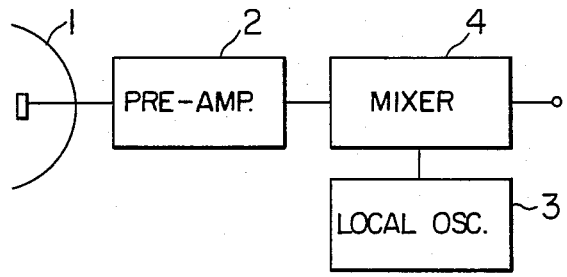
FIG. 1 shows a block diagram of major elements of an SHF band television signal receiver.
Figure 2A:
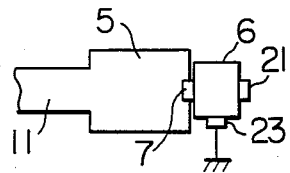
FIGS. 2a and 2b show patterns of prior art input matching circuits.
Figure 2B:
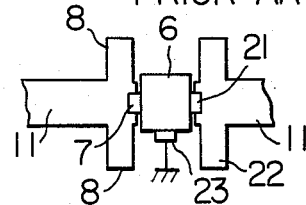
Figure 8:
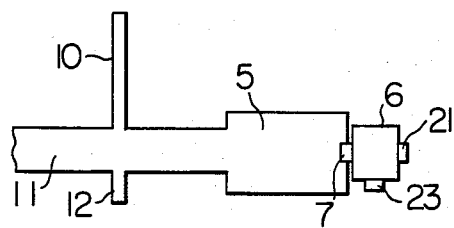
FIG. 8 shows a pattern of a fourth embodiment of the matching circuit of the present invention.
Figure 9:
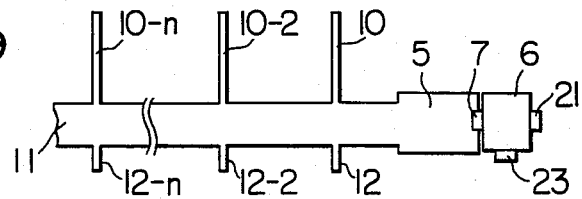
FIG. 9 shows a pattern of a fifth embodiment of the matching circuit of the present invention.

When the ¼ wavelength transformer 5 shown in FIG. 2a is used, the pair of stub lines 10 and 12 are connected at an approximately ¼ wavelength point of the center frequency of the operating frequency band from the junction point of the ¼ wavelength transformer 5 and the transmission line 11 as shown in FIG. 8. When a plurality of pairs of stub lines are connected at an interval of ½ wavelength of the center frequency as shown in FIG. 9, the image disturbance suppression characteristic is further improved.

As described hereinabove, in accordance with the present invention, there is provided a matching circuit for the pre-amplifier which uses the FET, in which a pair of stub lines which forms an image trap is connected to the gate electrode or the drain electrode of the FET, with the pair of stub lines being spaced from the stub line by approximately ¼ wavelength of the center frequency of the operating frequency band. As a result, the matching circuit for the pre-amplifier for the SHF band receiver having a wide band input/output characteristic and an excellent image disturbance suppression characteristic is provided.

When a plurality of pairs of stub lines are arranged at an interval of approximately ½ wavelength of the center frequency, the image disturbance suppression characteristic is further improved.

We claim:

1. A matching circuit for a pre-amplifier of an SHF band television signal receiver, the operating frequency band of said matching circuit including a first, a second, and a third frequency, said first frequency being lower than said third frequency, said second frequency being substantially the center between said first and third frequencies, said matching circuit comprising:
   (a) impedance matching means connected to a terminal of an amplifying device of said pre-amplifier;
   (b) a transmission line connected to said impedance matching means, said transmission line being arranged oppositely to said amplifying device; and (c) a first and a second stub line connected to said transmission line and spaced from said impedance matching means by a distance approximately equal to (2n-1)/4 wavelength (n=1,2,3, . . . ) of a wave of said second frequency, said first and second stub lines being arranged oppositely to each other with respect to said transmission line, said first stub line having a length selected so as to present an inductive impedance in said operating frequency band of said matching circuit and present substantially a short circuit at an image frequency of said second frequency, said second stub line having a length selected so as to present a capacitive impedance in said operating frequency band of said matching circuit and present an admittance which cancels an admittance of said first stub line at said second frequency.

2. A matching circuit according to claim 1, in which said impedance matching means is constituted by a transformer of a ¼ wavelength of the wave of said second frequency.

3. A matching circuit according to claim 1, in which said impedance matching means is constituted by a connecting line connected to said terminal of said amplifying device and a third stub line connected to said connecting line.

4. A matching circuit according to claim 1, in which said impedance matching means is connected to an input terminal of said amplifying device.

5. A matching circuit according to claim 1, in which said impedance matching means is connected to an output terminal of said amplifying device.

* * * * *